(12) United States Patent
Bargroff

(10) Patent No.: US 7,271,640 B2
(45) Date of Patent: Sep. 18, 2007

(54) MIXER CIRCUIT WITH BYPASS AND MIXING MODES HAVING CONSTANT EVEN ORDER GENERATION AND METHOD OF OPERATION

(75) Inventor: Keith P Bargroff, San Diego, CA (US)

(73) Assignee: RF Magic, Inc., San Diego, CA (US)

( * ) Notice: Subject to any disclaimer, the term of this patent is extended or adjusted under 35 U.S.C. 154(b) by 0 days.

(21) Appl. No.: 11/164,768

(22) Filed: Dec. 5, 2005

(65) Prior Publication Data
US 2006/0148440 A1    Jul. 6, 2006

Related U.S. Application Data

(63) Continuation of application No. 10/735,523, filed on Dec. 11, 2003, now abandoned.

(60) Provisional application No. 60/433,066, filed on Dec. 11, 2002, provisional application No. 60/433,061, filed on Dec. 11, 2002, provisional application No. 60/433,067, filed on Dec. 11, 2002, provisional application No. 60/433,063, filed on Dec. 11, 2002.

(51) Int. Cl.
*G06F 7/44* (2006.01)
(52) U.S. Cl. ...................... 327/356; 455/326
(58) Field of Classification Search ........ 327/356–359, 327/116, 119–122; 455/326, 333
See application file for complete search history.

(56) References Cited

U.S. PATENT DOCUMENTS 4,345,251 A    8/1982  Begeman et al.

4,705,967 A  * 11/1987  Vasile ..................... 327/581

(Continued)

FOREIGN PATENT DOCUMENTS

DE    201 03 220 U    6/2001

(Continued)

OTHER PUBLICATIONS

Courtesy copy of PCT ISR of PCT/US03/39741.

(Continued)

*Primary Examiner*—Kenneth B. Wells
(74) *Attorney, Agent, or Firm*—Clifford B. Perry

(57) ABSTRACT

A mixer circuit configured to operate in a bypass or mixing mode, and which comprises a mixer core, and a mode select circuit. The mixer core includes first and second switches, each of which has an input, and first and second outputs. The mode select circuit is coupled to the mixer core and includes third and fourth switches, which are collectively configured to operate in either a first state corresponding to the bypass mode, or a second state corresponding to the mixing mode. The input of the first switch is configured to receive a signal at a first frequency, wherein the first and second switches are configured to switch between their respective first and second outputs at a second frequency, and wherein, responsive to the state of the third and fourth switches, the first output of the first switch, and the second output of the second switch are each configured to output a signal which is either (i) at the first frequency, or (ii) a mixing product of the first and second frequencies.

41 Claims, 6 Drawing Sheets

U.S. PATENT DOCUMENTS

| | | |
|---|---|---|
| 4,931,802 A | 6/1990 | Assal et al. |
| 4,953,184 A | 8/1990 | Simone |
| 5,073,930 A | 12/1991 | Green |
| 5,184,084 A | 2/1993 | Yun |
| 5,220,419 A | 6/1993 | Sklar |
| 5,278,837 A | 1/1994 | Kelley |
| 5,285,284 A | 2/1994 | Takashima et al. |
| 5,319,673 A | 6/1994 | Briskman |
| 5,339,454 A | 8/1994 | Kuo et al. |
| 5,654,774 A | 8/1997 | Pugel et al. |
| 5,715,532 A | 2/1998 | Sagawa et al. |
| 5,852,662 A * | 12/1998 | Forgues ............... 380/275 |
| 5,881,369 A | 3/1999 | Dean et al. |
| 6,005,861 A | 12/1999 | Humpleman |
| 6,072,994 A | 6/2000 | Phillips et al. |
| 6,295,282 B1 | 9/2001 | Buer et al. |
| 6,353,463 B1 | 3/2002 | Seo |
| 6,408,164 B1 | 6/2002 | Lazaris-Brunner et al. |
| 6,417,733 B1 | 7/2002 | Corsi et al. |
| 6,434,374 B1 | 8/2002 | Mutterspaugh |
| 6,437,837 B1 | 8/2002 | Seo |
| 6,498,926 B1 | 12/2002 | Ciccarelli |
| 6,509,777 B2 | 1/2003 | Razavi et al. |
| 6,510,185 B2 | 1/2003 | Lee et al. |
| 6,584,304 B1 | 6/2003 | Thomsen et al. |
| 6,882,834 B1 | 4/2005 | Balboni |
| 6,987,958 B1 | 1/2006 | Lo et al. |
| 2003/0190900 A1 | 10/2003 | Yasuda et al. |
| 2004/0203337 A1 | 10/2004 | Ammar |

FOREIGN PATENT DOCUMENTS

| | | |
|---|---|---|
| EP | 0 757 489 | 2/1996 |
| EP | 1 009 113 | 6/2000 |
| WO | WO97/49240 | 12/1997 |
| WO | WO99/43104 | 8/1999 |
| WO | WO 00/22735 | 4/2000 |
| WO | WO 02/082671 | 10/2002 |

OTHER PUBLICATIONS

Courtesy copy of PCT ISR of PCT/US03/39677.
Courtesy copy of PCT ISR of PCT/US03/39678.
"Information for Installers of Hot Bird™ DVB-S Systems," Version 1.0, Jun. 7, 1999.
"Digital Satellite Equipment Control (DiSEqC™), Update and Recommendations for Implementation," Version 2.0, Apr. 18, 1997.
Kwentus et al., "A Single-Chip Universal Digital Satellite Reciever with 480-MHz IF Input," Nov. 1999, IEEE J. of S.S. Circ., vol. 34, No. 11, pp. 1634-1646.
Datashett for Philips Semicondcutors UAAA3202M Frequency Shift Keying (FSK) Receiver, Aug. 1997.
"RCA DIRECTV™ Receiver with Ultimate TV® Service Setup Guide," 2000.

* cited by examiner

MIXER CIRCUIT WITH BYPASS AND MIXING MODES HAVING CONSTANT EVEN ORDER GENERATION AND METHOD OF OPERATION

CROSS REFERENCE TO RELATED APPLICATIONS

This application is a continuation of U.S. patent application Ser. No. 10/735,523, filed Dec. 11, 2003, now abandoned, which claims priority to, and incorporates by reference, each of the following applications:

U.S. Provisional Patent Application Ser. No. 60/433,066, filed on Dec. 11, 2002, entitled "INTEGRATED CROSS-POINT SWITCH WITH BAND TRANSLATION;"

U.S. Provisional Patent Application Ser. No. 60/433,061, filed on Dec. 11, 2002, entitled "IN-LINE CASCADABLE DEVICE IN SIGNAL DISTRIBUTION SYSTEM WITH AGC FUNCTION"

U.S. Provisional Patent Application Ser. No. 60/433,067, filed on Dec. 11, 2002, entitled "N×M CROSSPOINT SWITCH WITH BAND TRANSLATION;" and U.S. Provisional Patent Application No. 60/433,063, filed on Dec. 11, 2002, entitled "MIXER WITH PASS-THROUGH MODE WITH CONSTANT EVEN ORDER GENERATION".

Each of the aforementioned applications is herein incorporated by reference in their entirety for all purposes.

BACKGROUND

The present invention relates generally to mixer circuits, and in particular to a mixer circuit which can operate in either a bypass mode or mixing mode while retaining a high level of even order mixer product suppression.

Communication systems which transmit and receive signals often employ one or more mixing circuits to translate signals at a one frequency to another frequency. As known to the practitioner, the mixing circuits usually include two input ports for receiving two signals, typically identified as RF and LO signals, and an output port for providing a signal at the mixing product of the two input signals. As is well known, the mixing product of the two signals, typically referred to as the IF signal, may be expressed as:

$$IF = |Mf_{RF} \pm Nf_{LO}|$$

As can be seen, signals at multiple frequencies are produced during the mixing process, one of which is most often desired, e.g., a downconverted signal at frequency RF-LO. The presence of remaining signals at frequencies within the operational band of the mixer's output, conventionally referred to as "interferers," can be problematic, as they can interfere with the proper operation of the communication system. Accordingly, the elimination of unwanted interferers is an important design criterion in most systems.

Several mixer architectures are known in the art as providing rejection of at least some of the potentially interfering signals. For example, doubly balanced mixers are known in the art as providing excellent rejection of even order mixing products, a characteristic which makes the architecture ideal in a variety of communication systems.

FIG. 1A illustrates a simplified switch diagram of a doubly balanced mixer as known in the art. The mixer 100 includes RF and IF ports 110 and 130, respectively, each of which is shown differentially, but may be single-ended in another embodiment. The differential RF signal 110 is supplied to the input of SPDT switches 122, the states of which are switched at a rate determined by an LO signal 125 supplied thereto. The outputs of the switches 122 are coupled to differential IF ports 130 operable to provide the differential IF signal 130.

FIG. 1B illustrates the doubly balanced mixer of FIG. 1A as a Gilbert cell multiplier or mixer circuit known in the art. The mixer circuit includes two cross-coupled differential transistor pairs 122 whose base terminals are coupled to the LO source 125, collector terminals are coupled to the IF loads 130, and emitter terminals are coupled to buffer transistors 117. Responsive to the differential RF signal applied at terminals 110a and 110b, a voltage difference is established across resistor 115, resulting in the corresponding modulation of the quiescently-supplied current driving the transistor pairs 122 that comprise the mixer core. Those skilled in the art will appreciate that illustrated mixer circuit is only exemplary, and numerous variations of the circuit are also widely used.

While doubly balanced mixers provide a high level of even order mixing product suppression, circuit imperfections lead to degradation in that suppression. For example, a relatively low impedance parasitic 112 (e.g., capacitance) can load the emitter nodes of the mixers, the impedance operating to convert the rectified LO voltage into a common mode even order LO interferer current. The LO interferer can then pass through the mixer core and to the output loads.

Reduced mixer even-order suppression can be especially problematic when the mixer is integrated with other circuitry. FIG. 2 illustrates one example of such an instance where multiple mixers are supplied by a single VCO. Each mixer is configured to operate in either a mixing mode, whereby the synthesized signal 205 and input signals 210a and 210b are provided to respective mixers 220a and 220b to produce respective mixed signals 230a and 230b, or in a bypass mode, whereby the synthesized signal 205 is not supplied to the mixer 220c and the input signal 210c is routed such that it bypasses the mixer 220c.

In such a system, the LO even order mixer interferers can couple to the VCO via substrate leakage, indirect conductor leakage (ground, power or logic lines), magnetic or electrostatic coupling, or other such means. Within the VCO, the even order interferers may cause spurs in the VCO output, or may combine with odd order harmonics of the desired signal to produce an interfering signal at the desired frequency of oscillation. In the latter case, the interfering signal will produce a phase offset in the VCO-generated output. If that coupling should change, a phase step will be introduced into the system which the PLL will attempt to correct for. If the phase step is large enough, the consequence can be a disruption of the digital demodulation process.

What is therefore needed is a new mixer circuit operable in either a bypass mode or mixing mode, and which can maintain a substantially constant level of LO even order interference independent of its operation in either the bypass or mixing mode.

SUMMARY

The invention described herein provides for a mixer circuit which is operable in either a bypass mode or mixing mode and which can maintain a substantially constant level of LO even order interference while operating within or switching between the bypass or mixing modes. A substantially constant level of LO even order interference can be maintained by: (i) maintaining the circuit path between the IF load and mixer core during both the bypass and mixer modes of operation, and (ii) maintaining mixer operation during bypass mode operation.

The invention is now summarized in various embodiments, the first of which describes a mixer circuit having a mixer core and a mode select circuit. The mixer core includes first and second switches, each of which has an input switchable between first and second outputs. The mode select circuit is coupled to the mixer core and includes third and fourth switches, which are collectively configured to operate in either a first state corresponding to the bypass mode, or a second state corresponding to the mixing mode.

The third switch has an input coupled to the second output of the first switch, the input switchable between a first output which is coupled to the first output of the first switch, and a second output which is coupled to the second output of the second switch. The fourth switch has an input coupled to the first output of the second switch, and is switchable between a first output which is coupled to the first output of the first switch, and a second output coupled to the second output of the second switch.

The input of the first switch is configured to receive a signal at a first frequency, wherein the first and second switches are configured to switch between their respective first and second outputs at a second frequency, and wherein, responsive to the selected output of the third and fourth switches, the first output of the first switch, and the second output of the second switch are each configured to output a signal which is either (i) at the first frequency, or (ii) a mixing product of the first and second frequencies.

Other embodiments of the invention, as well as particular features of the embodiments will be more readily understood in view of the following drawings and detailed description.

DETAILED DESCRIPTION

Figure 1A:
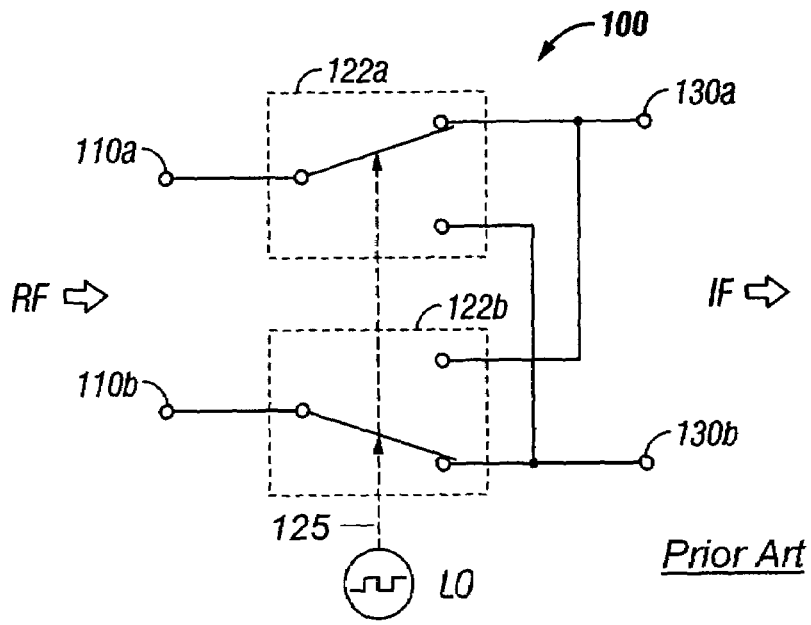
FIG. 1A illustrates a simplified switch diagram of a doubly balanced mixer as known in the art.
Figure 1B:
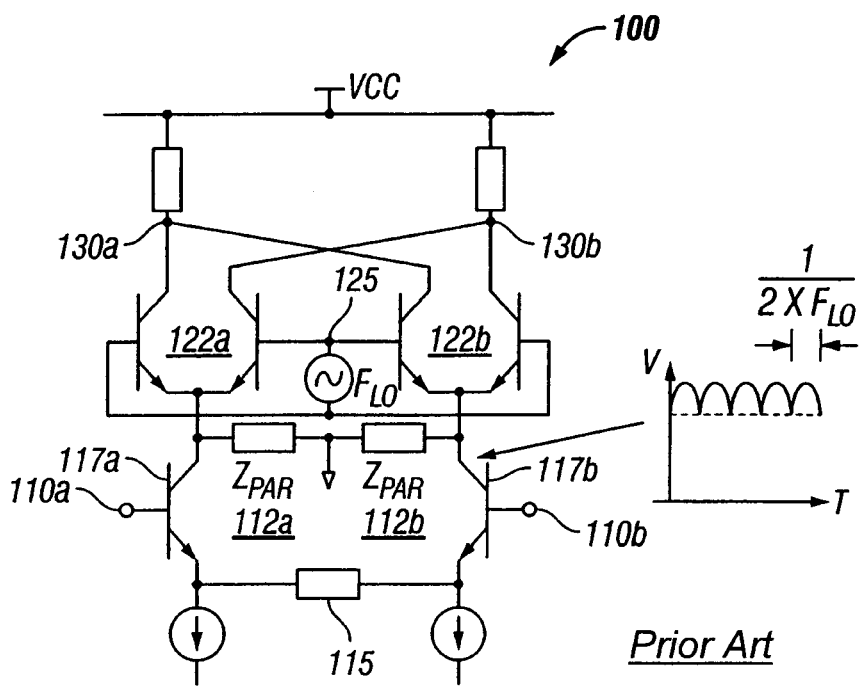
FIG. 1B illustrates the doubly balanced mixer of FIG. 1A as a Gilbert cell mixer circuit.
Figure 2:
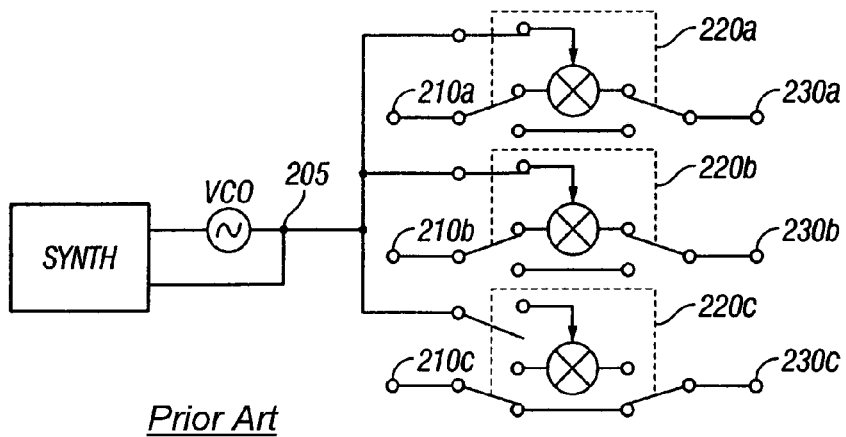
FIG. 2 illustrates a common oscillator, multiple mixer system in which the mixer circuit could be employed.
Figure 3A:
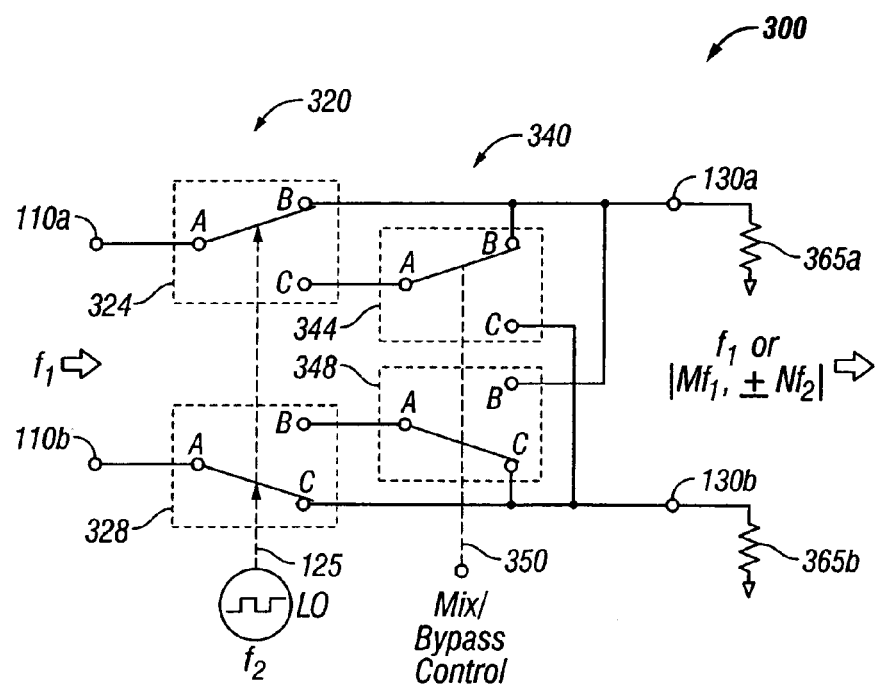
FIG. 3A illustrates a simplified switch diagram of a mixer circuit in accordance with one embodiment of the present invention.

FIG. 3A illustrates a simplified switch diagram of a mixer circuit 300 in accordance with one embodiment of the present invention. The mixer circuit 300 includes a mixer core 320 and a mode select circuit 340. The mixer core 320 includes two input switches 324 and 328, each switch having an input 324a, 328a, and two outputs 324b, 324c, and 328b, 328c, respectively. Switches are depicted to convey the component's general function, and those skilled in the art will readily appreciate that each may be realized using an variety of circuit elements, including transistors (BJT and FET types), diodes, and the like. Accordingly, as used herein, the term "switch" or "switches" shall denote any of these circuit elements, or equivalents thereof.

Input switches 324 and 328 are operable to accept a signal at a first frequency $f_1$ in either a differential or single-sided form. In a differential form, the first frequency signal $f_1$ will consist of a differential signal, wherein separate polarities of the first frequency signal $f_1$ are supplied to separate switch inputs 110a and 110b, respectively. During single-sided operation, only one of the switches' inputs (e.g., 110a) is needed to receive the first frequency signal $f_1$. In this embodiment, the input of the other switch (e.g., 110b) is coupled to an ac ground.

The first and second switches 324 and 328 are further configured to receive a switching signal 125, which operates to switch the first and second switches between their respective output states at a second frequency $f_2$, as will be further described below. In a particular embodiment shown, the first and second switches 324 and 328 are configured such that both, upon receiving the switching signal 125, switch to the opposite states (i.e., one to its first output, and the other to its second output). In such an embodiment, the switching signal 125 may be supplied in anti-phase to configure the first and second switches in opposite output states.

The mixer circuit 300 further includes a mode select circuit 340, implemented in one embodiment as third and fourth switches 344 and 348. Third switch 340 includes an input 344a switchable to two outputs 344b and 344c, and fourth switch 348 includes an input 348a switchable to two outputs 348b and 348c. As shown, the third switch's input 344a is coupled to the second output 324c of the first switch. The third switch's first output 344b is coupled to the first switch's first output 324b, and the third switch's second output 344c is coupled to the second switch's second output 328c. The fourth switch's input 348a is coupled to the second switch's first output 328b. The fourth switch's first output 348b is coupled to the first switch's first output 324b, and a second output 348c coupled to the second switch's second output 328c.

The third and fourth switches are further configured to receive a mode select signal 350 operable to select the output state of the third and fourth switches 344 and 348. In a specific embodiment, the third and fourth switches 344 and 348 are collectively configured to operate in one of two states: a bypass state or a mixing state. The bypass state is exemplified in FIG. 3A with the third switch 344 coupled to its first output 344b and the fourth switch 348 coupled to its second output 348c as shown in FIG. 3A. The mixing state could be alternatively realized by switching both states of the third and fourth switches, as will be further illustrated below. The resulting bypass or mixed signal is provided in differential form at output ports 130a and 130b. IF loads 365a and 365b are each coupled to a respective output port and an ac ground, as described below. In an alternative embodiment, a single IF load may be coupled between ports 365a and 365b. The term "IF" load shall not infer that the loads' frequency of operation is limited to those frequencies below the input signals, and in fact may be a higher operational frequency when the desired mixing product is an upconverted signal. Further, the IF load may comprise active or passive components as known in the art.

The switches (or their corresponding implementation in transistors, diodes, or other components) may be discretely or integrally formed using a variety of fabrication techniques known in the art, including monolithic fabrication in a Bipolar Complementary Metal Oxide Semiconductor (Bi- CMOS) process. Additional circuitry described herein, such as IF loads and oscillator circuitry, as well as other components may be monolithically formed onto an integrated circuit device in accordance with the present invention.

Figure 3B:
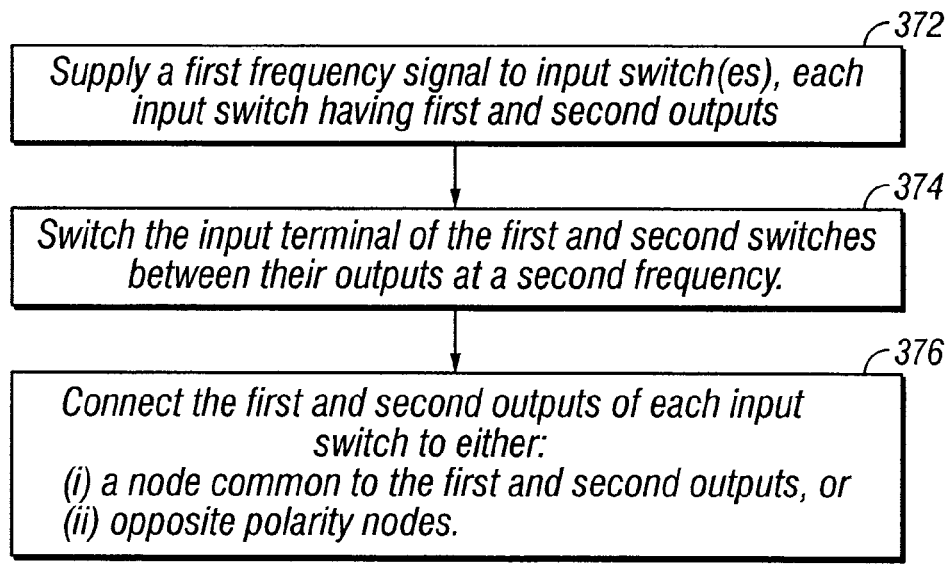
FIG. 3B illustrates a method of operating the mixer circuit shown in FIG. 3A in accordance with the present invention.

FIG. 3B illustrates a method for operating the mixer circuit shown in FIG. 3A in accordance with the present invention. Initially at 372, a first frequency signal is supplied to one or both of the input switches 324 and 328. As explained above, the first frequency signal may be in the form of a single-sided signal, in which case the first frequency signal is applied to one of the inputs 110a or 110b, the other switch input being coupled to an ac ground. In the case of an applied differential signal, oppositely polarized signals are supplied to respective signal inputs 110a and 110b.

Next at 374, the input terminal of the first and second switches is switched between each switch's first and second output at a second frequency f.sub.2. In a specific embodiment, this process is performed by using the second frequency signal as a switch control signal. In such an embodiment, an oscillator or other frequency source used to generate the second frequency signal may be local/integrated with one or more of the switches, or may be externally located and supplied to the first and second switches via a transmission medium.

Next at 376, the first and second outputs of each input switch are coupled to either: (i) a node common to the switch's first and second outputs, or (ii) nodes of opposite polarity. Connecting the two outputs to a common node results in the first frequency signal being output at 130 (bypass mode), and connecting the two outputs to opposite polarity nodes results in a mixing operation of the first and second frequency signals, and accordingly the generation of one or more mixing products therefrom. The process of 376 is performed by the mode select circuit 340 illustrated in FIG. 3A, whereby in the bypass mode of operation the third switch is configured to connect the first and second outputs of the first switch 324 to a common node 130a, and the fourth switch 348 is configured to connect the first and second outputs of the second switch 328 to a common node 130b. To operate in the alternate mixing mode, the process is performed by switching the states of the third and fourth switches. In this state, the first and second outputs of the first switch 324 will alternately connect to opposite polarity nodes 130a and 130b, and the first and second outputs of the second switch 328 will also alternately connect to opposite polarity nodes 130b and 130a. In this manner, the output states of the third and fourth switches 344 and 348 are configurable either in a bypass mode where the outputs of the first and second switches are connected to a common node, or in a mixing mode where the outputs of the first and second switches are connected to opposite polarity nodes. Further preferably, the connection between the mixer core (first and second switches) and the IF loads 365a and 365b is maintained during operation in either the bypass mode or mixing mode. Additionally, the first and second switches are controlled to continuously switch between their respective outputs at the second frequency during operation in either the bypass or mixing modes. As noted above, a single IF load may be coupled between nodes 130a and 130b in an alternative embodiment under the present invention.

Figure 3C:
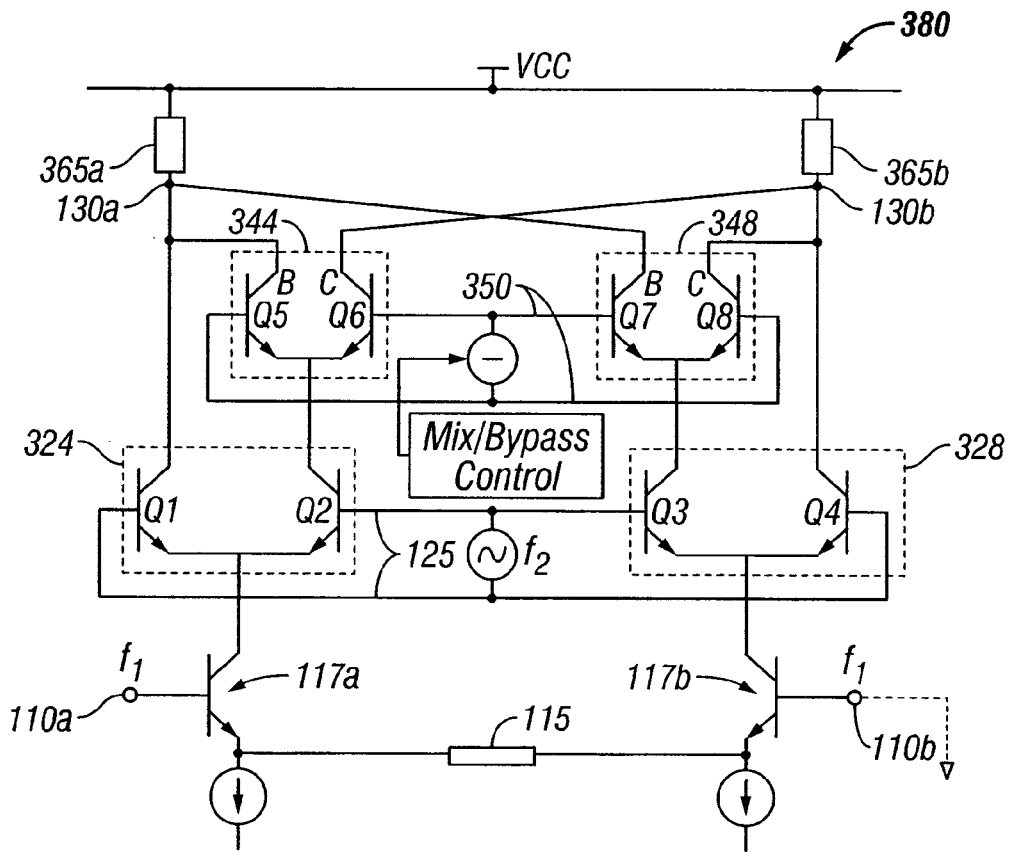
FIG. 3C illustrates the mixer circuit of FIG. 3A as a modified Gilbert cell mixer circuit in accordance with the present invention.

FIG. 3C illustrates the mixer circuit of FIG. 3A as a modified Gilbert cell mixer circuit 380 in accordance with the present invention, with previously identified components retaining their reference numerals. As depicted, each of the switches 324, 328, 344, and 348 are implemented as a differential pair of npn bipolar junction transistors Q1–Q8.

A mixer/bypass control circuit produces a control signal 350 which is supplied differentially to the base terminals of the mode select switches 344 and 348. The polarity of control signal may be reversed to switch circuit operation between bypass and mixing modes. A signal source (e.g., a LO source) is operable to provide the second frequency signal 125 to the mixer core switches 324 and 328. The input signal f.sub.1 is applied to the input terminals 110a and 110b of buffer transistors 117, or alternatively may be provided as a single-ended signal, in which case one of the input terminals 110a or 110b is coupled to an ac ground, as described above.

In a specific embodiment of the mixer circuit 380, transistors Q1–Q8 are npn bipolar transistors 20 um.times.0.4 um, IF loads 365a and 365b are 200 ohms, resistor 115 is 200 ohms, the first frequency signal f.sub.1 operates at 950–2150 MHz, the second frequency signal f.sub.2 operates at 3100 MHz, and the mode select signal 350 is 500 mV DC. The circuit's supply $V_{CC}$ operates at +6 VDC. Further specifically, the illustrated components are integrally formed using a 0.35 um Bi-CMOS photolithographic process. Skilled practitioners will appreciate that that the circuit 380 can be alternatively realized using various modifications, e.g., pnp-type bipolar transistors, n or p-type field effect transistors, or other components such as diodes, and the like.

Figure 4:
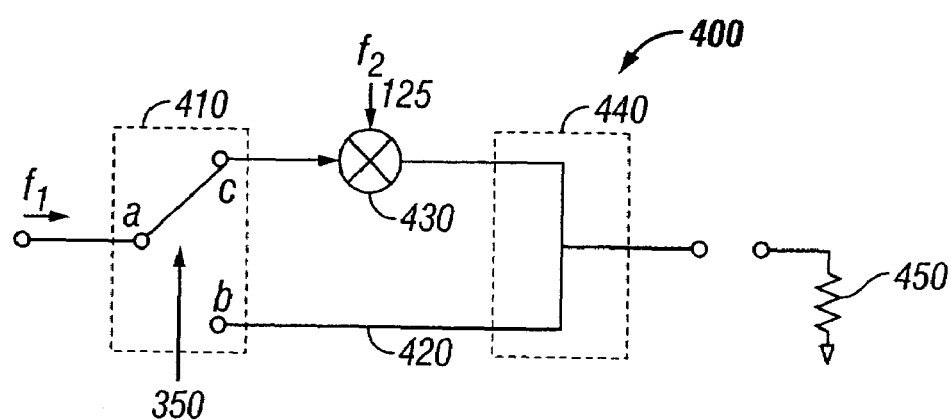
FIG. 4 illustrates a second embodiment of the mixer circuit in accordance with the present invention.

FIG. 4 illustrates a second embodiment of the mixer circuit in accordance with the present invention. The mixer circuit 400 includes a mode select switch 410 having an input 410a to receive the first frequency signal $f_1$, a first output 410b coupled to a bypass circuit 420, and a second output 410c coupled to a mixing core 430. The bypass circuit 420 may be any transmission medium operable to support the propagation of the first frequency signal therealong, including printed/integrated circuit traces (including ungrounded lines or grounded lines such as microstrip, stripline, coplanar waveguide and the like), wire, twisted pair line, coaxial cable, conductive or dielectric waveguide, and the like. The mixer core 430 has an input coupled to the switch's second output 410c, a second input operable to receive the second frequency signal 125, and an output. The mixer core 430 can be of any conventional type (i.e., single-ended, singly-balanced, doubly balanced, etc.) and realized in any of the known forms, such as a Gilbert cell mixer.

The mixer circuit further comprises a signal combiner 440 coupled to the bypass circuit 420 and the mixer output. The signal combiner 440 has an output coupled to a common load 450. The signal combiner may be realized as a commonly connected port, power combiner (active or passive), or similar circuits. Selection of the bypass or mixing mode is provided by a mode select signal 350, which is supplied by a control circuit. The mixer core 430 is supplied the second frequency signal 125 via a local oscillator. One or more of the described components may be integrally fabricated into a monolithic circuit using semiconductor processing techniques appropriate for the particular material. Preferably, the operation of the mixer core continues and circuit connections between the mixer core 430 and the common load 450 is maintained during operation within or switching between the bypass and mixing modes.

Figure 5A:
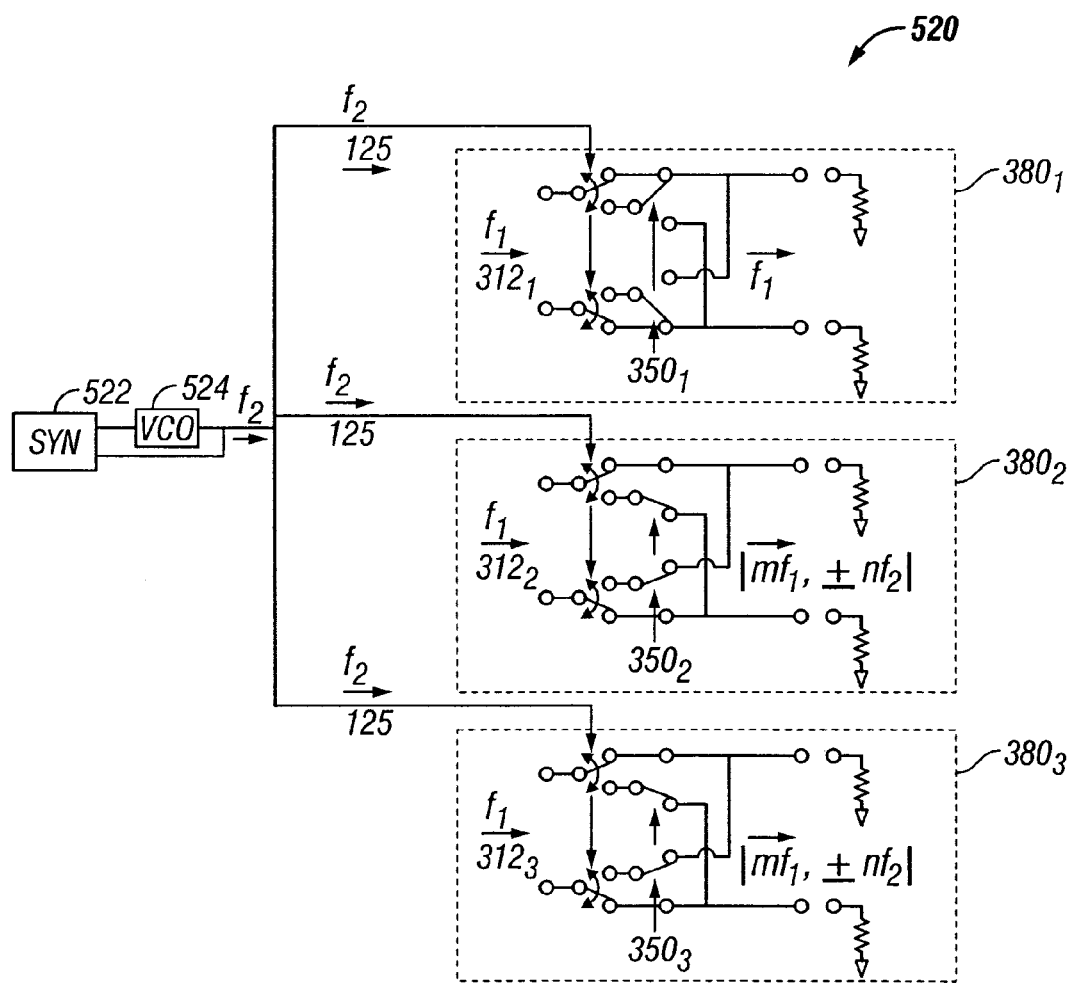
FIGS. 5A and 5B illustrates common oscillator, multiple mixer systems utilizing the mixer circuits of FIGS. 3A and 4 in accordance with embodiments of the present invention.
Figure 5B:
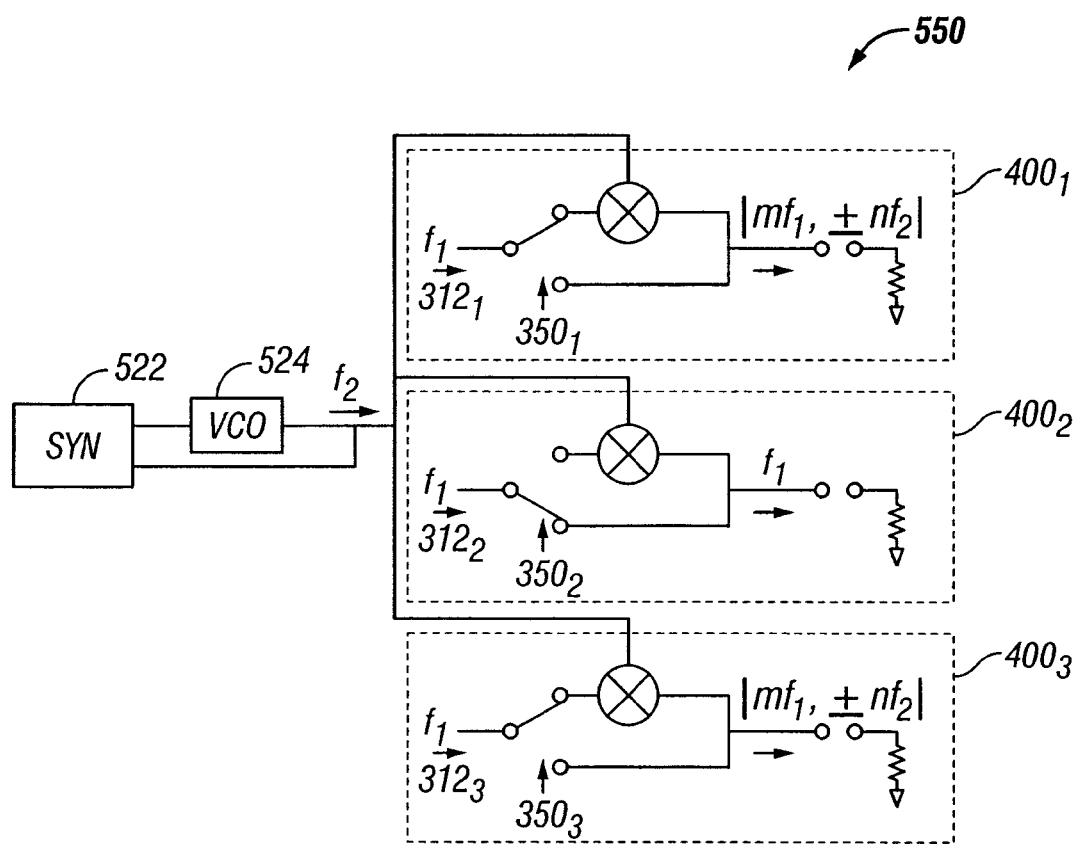

FIGS. 5A and 5B illustrate exemplary systems using the improved mixer circuit of FIG. 3A or 4 in accordance with the present invention, the exemplary systems comprising a common oscillator, multiple mixer system. Referring first to FIG. 5A, the system 520 includes a frequency synthesizer 522 and a VCO 524 coupled to three mixer circuits $380_{1-3}$, the detailed architecture of each being described in FIGS. 3A and 3C, above. The frequency synthesizer 522 and VCO 524 operate to produce the second signal frequency $f_2$, which is supplied to each of the three mixer circuits $380_{1-3}$. Each mixer circuit $380_{1-3}$ is additionally supplied with a first frequency signal $312_{1-3}$ in differential form. Each first frequency signal $312_{1-3}$ is identified as $f_1$ for convenience, and the reader will appreciate that each of these frequencies may be different.

The mixer circuits $380_{1-3}$ are supplied respective mode select signals $350_{1-3}$ to configure each corresponding mixer circuit to their desired output. In the shown embodiment, the first mixer circuit $380_1$ is supplied a "bypass" mode signal $350_1$, resulting in the (differential) output at the first signal frequency $f_1$. The second mixer circuit $380_2$ is supplied a "mix" mode signal $350_2$, resulting in the output of the mixing product described above. Similarly, the third mixer circuit $380_3$ receives the first and second frequency signals $f_1$, $f_2$, and the "mix" mode signal $350_3$, resulting in the mixing mode of operation. Preferably, the first and second switches of each mixer circuit $380_{1-3}$ continues to switch at the second frequency $f_2$ regardless of whether the supplied control signal $350_{1-3}$ sets the mixer circuit to a bypass mode or mixing mode. Additionally, the mixer circuit's coupling to the IF loads $365a$ and $365b$ (or to a single IF load coupled between differential nodes $130a$ and $130b$) is maintained during and switching between the bypass and mixing modes.

FIG. 5B illustrates another embodiment of a common oscillator, multiple mixer system 550 in which the mixer circuit of FIG. 4 is employed. The system 550 similarly employs a frequency synthesizer 522 and a VCO 524 for generating the second frequency signal $f_2$ which is commonly supplied to the mixer circuits $400_{1-3}$. In this system, the first frequency signal $312_{1-3}$ (identified as $f_1$ for convenience only) is supplied to the input of each mixer circuit. A corresponding mode select signal $350_{1-3}$ is also supplied to set the switches in the desired bypass or mixing mode enabling the independent control of each mixer circuit in either a bypass or mixing mode. As described above with respect to the mixer embodiment of FIG. 4, the operation of the mixer continues and circuit connections between the mixer core 430 and the common load 450 can be maintained during operation within or switching between the bypass and mixing modes in order to maintain a substantially constant level of LO even-order interference.

When operated in the aforementioned manner, the mixer circuits of the present invention retain a substantially constant level of LO even-order interference whether they are operating within, or are switched between a bypass or mixing mode state. Consequently, the mixers' even order interferers will (i) produce substantially constant spurious products in the VCO output which typically fall outside of the PLL loop bandwidth, and/or (ii) combine with odd order LO products to produce a substantially constant phase-offset at the desired VCO frequency, which can be easily corrected by the PLL.

While the above is a detail description of the present invention, it is only exemplary and various modifications, alterations and equivalents may be employed in various apparati and processes described herein. Accordingly, the scope of the present invention is hereby defined by the metes and bounds of the following claims.

What is claimed is:

1. A mixer circuit, comprising:
   a mixer core, comprising:
      a first switch having an input switchable between a first output and a second output; and
      a second switch having an input switchable between a first output and a second output; and
   a mode select circuit coupled to the mixer core, the mode select circuit comprising:
      a third switch having an input coupled to second output of the first switch, the input switchable between a first output coupled to the first output of the first switch, and a second output coupled to the second output of the second switch; and
      a fourth switch having an input coupled to the first output of the second switch, the input switchable between a first output coupled to the first output of the first switch, and a second output coupled to the second output of the second switch.

2. The mixer circuit of claim 1, wherein the inputs of the first and second switches are configured to receive oppositely polarized signals comprising a differential signal.

3. The mixer circuit of claim 1, wherein one of the first or second switch inputs is configured to receive a single-ended signal, and wherein the other first or second switch input is coupled to an ac ground potential.

4. The mixer circuit of claim 1, wherein the inputs of the first and second switches are configured to receive a differential input signal operating at a first frequency, wherein the first and second switches are configured to switch their respective inputs between their two outputs at a second frequency, and wherein, responsive to the selected output of the third and fourth switches, the first output of the first switch, and the second output of the second switch are configured to output a signal which is either (i) at the first frequency, or (ii) a mixing product of the first frequency and the second frequency.

5. The mixer circuit of claim 1, further comprising an oscillator coupled to the first and second switches, the oscillator outputting a signal at the second frequency which operates to switch, at the second frequency, each of the inputs of the first and second switches between their respective first and second outputs.

6. The mixer circuit of claim 1, further comprising at least one IF load coupled to the first output of the first switch and the second output of the second switch.

7. The mixer circuit of claim 6, wherein the at least one IF load comprises one IF load coupled between the first output of the first switch and the second output of the second switch.

8. The mixer circuit of claim 6, wherein at least one IF load comprises a first IF load coupled between the first output of the first switch and an ac ground, and a second IF load coupled between the second output of the second switch and an ac ground.

9. The mixer circuit of claim 6, wherein each of the first and second switches is operable to switch between its first and second outputs at a predefined frequency.

10. The mixer circuit of claim 9, wherein: (i) the input of each of the first and second switches are operable to continue switching between their respective first and second outputs at the predefined frequency, and (ii) the at least one IF load is operable to maintain its coupling to the first output of the first switch and to the second output of the second switch during mixer operation in both the mixing mode and the bypass mode.

11. The mixer circuit of claim 1, wherein each of the first, second, third and fourth switches comprise bipolar junction transistors, field effect transistors, or diodes.

12. The mixer of claim 1, wherein each of the first, second, third, and fourth switches comprises a differential transistor pair.

13. The mixer circuit of claim 12, wherein:
the first switch comprises a first differential pair having first and second base terminals, commonly-connected emitter terminals, and first and second collector terminals;
the second switch comprises a second differential pair having a first base terminal coupled to the second base terminal of the first differential pair, a second base terminal coupled to the first base terminal of the first differential pair, commonly-connected emitter terminals, and first and second collector terminals;
the third switch comprises a third differential pair having first and second base terminals, commonly-connected emitter terminals coupled to the second collector terminal of the first differential pair, a first collector terminal coupled to the first collector terminal of the first differential pair, and a second collector terminal coupled to the second collector terminal of the second differential pair; and
the fourth switch comprises a fourth differential pair having a first base terminal coupled to the second base terminal of the third differential pair, a second base terminal coupled to the first base terminal of the third differential pair, commonly-connected emitter terminals coupled to first collector terminal of the second differential pair, a first collector terminal coupled to the first collector terminal of the first differential pair, and a second collector terminal coupled to the second collector terminal of the second differential pair.

14. The mixer circuit of claim 13, wherein the first switch further comprises a first buffer transistor having a collector terminal coupled to the commonly-connected emitter terminals of the first differential pair, an emitter terminal, and a base terminal comprising the input of the first switch, wherein the second switch further comprises a second buffer transistor having a collector terminal coupled to the commonly-connected emitter terminals of the second differential pair, an emitter terminal, and a base terminal comprising the input of the second switch, the mixer circuit further comprising at least one resistor coupled between the emitter terminals of the first and second buffer transistors.

15. The mixer circuit of claim 13, further comprising an oscillator coupled to the base terminals of the first and second differential pairs, the oscillator operable to supply a signal operating at the second frequency to the first and second differential pairs during both the bypass and mixing modes of operation.

16. The mixer circuit of claim 13, further comprising:
a first IF load coupled between the first collector terminal of the first differential pair and an ac ground; and
a second IF load coupled between the second collector terminal of the second differential pair and an ac ground.

17. The mixer of claim 13, further comprising an IF load coupled between first collector terminal of the first differential pair and the second collector terminal of the second differential pair.

18. A mixer circuit configured to operate in a bypass or mixing mode, the mixer circuit comprising:
a mixer core, which comprises:
a first switch having an input, a first output, and a second output; and
a second switch having an input, a first output, and a second output; and
a mode select circuit coupled to the mixer core, the mode select circuit comprising:
first switching means for coupling the first and second outputs of the first switch to either (i) a common potential node or (ii) opposite polarity nodes; and
second switching means for coupling the first and second outputs of the second switch to either (i) a common potential node or (ii) opposite polarity nodes.

19. The mixer circuit of claim 18, wherein the first switching means comprises a third switch having an input coupled to second output of the first switch, the input switchable between a first output coupled to the first output of the first switch, a second output coupled to the second output of the second switch.

20. The mixer circuit of claim 19, wherein the second switching means comprises a fourth switch having an input coupled to the first output of the second switch, the input switchable between a first output coupled to the first output of the first switch, and a second output coupled to the second output of the second switch.

21. The mixer of claim 20, further comprising an oscillator coupled to the first and second switches, the oscillator outputting a signal at the second frequency which operates to switch, at the second frequency, each of the inputs of the first and second switches between their respective first and second outputs.

22. The mixer circuit of claim 18, further comprising at least one IF load coupled to the first output of the first switch and the second output of the second switch.

23. The mixer circuit of claim 22, wherein the at least one IF load comprises one IF load coupled between the first output of the first switch and the second output of the second switch.

24. The mixer circuit of claim 22, wherein at least one IF load comprises a first IF load coupled between the first output of the first switch and an ac ground, and a second IF load coupled between the second output of the second switch and an ac ground.

25. The mixer circuit of claim 22, wherein each of the first and second switches is operable to switch between its first and second output at a predefined frequency.

26. The mixer circuit of claim 25, wherein: (i) the input of each of the first and second switches are operable to continue switching between their respective first and second outputs at the predefined frequency, and (ii) the at least one IF load is operable to maintain its coupling to the first output of the first switch and to the second output of the second switch during mixer operation in both the mixing mode and the bypass mode.

27. A common oscillator, multiple mixer system, comprising:
an oscillator configured to output a reference signal operating at an reference frequency; and
a plurality of mixer circuits, each mixer circuit coupled to receive the reference signal and each mixer circuit comprising:
a mixer core, further comprising:
a first switch having an input switchable between a first output and a second output; and
a second switch having an input switchable between a first output and a second output; and
a mode select circuit coupled to the mixer core, the mode select circuit comprising:
a third switch having an input coupled to second output of the first switch, the input switchable between a first output coupled to the first output of the first switch, and a second output coupled to the second output of the second switch; and a fourth switch having an input coupled to the first output of the second switch, the input switchable between a first output coupled to the first output of the first switch, and a second output coupled to the second output of the second switch.

28. The common oscillator, multiple mixer system, of claim 27, wherein the inputs of the first and second switches are configured to receive oppositely polarized signals comprising a differential signal.

29. The common oscillator, multiple mixer system of claim 27, wherein one of the first or second switch inputs is configured to receive a single-ended signal, and wherein the other first or second switch input is coupled to an ac ground potential.

30. The common oscillator, multiple mixer system of claim 27, wherein the inputs of the first and second switches are configured to receive a differential input signal operating at a respective input frequency and, wherein the first and second switches of each mixer circuit are configured to receive the reference signal and, in response, switch between their respective first and second outputs at the reference frequency, and wherein, responsive to the selected output of the third and fourth switches, the first output of the first switch, and the second output of the second switch of each mixer circuit are configured to output a signal which is either (i) at the respective input frequency, or (ii) a mixing product of the respective input frequency and the reference frequency.

31. The common oscillator, multiple mixer system of claim 27, further comprising an oscillator coupled to the first and second switches, the oscillator outputting a signal at the reference frequency which operates to switch, at the reference frequency, each of the inputs of the first and second switches between their respective first and second outputs.

32. The common oscillator, multiple mixer system of claim 27, further comprising at least one IF load coupled to the first output of the first switch and the second output of the second switch.

33. The common oscillator, multiple mixer system of claim 32, wherein the at least one IF load comprises one IF load coupled between the first output of the first switch and the second output of the second switch.

34. The common oscillator, multiple mixer system of claim 32, wherein at least one IF load comprises a first IF load coupled between the first output of the first switch and an ac ground, and a second IF load coupled between the second output of the second switch and an ac ground.

35. The common oscillator, multiple mixer system of claim 32, wherein each of the first and second switches is operable to switch between its first and second output at the reference frequency.

36. The common oscillator, multiple mixer system of claim 35, wherein: (i) the input of each of the first and second switches are operable to continue switching between their respective first and second outputs at the reference frequency, and (ii) the at least one IF load is operable to maintain its coupling to the first output of the first switch and to the second output of the second switch during mixer operation in both the mixing mode and the bypass mode.

37. In a system which receives a first signal operating at a first frequency, a method for selectively outputting either the first signal operating at the first frequency, or a signal operating at a frequency defined by the mixing product of the first frequency and a second frequency, the method comprising:
  supplying the first signal to at least one of two input switches, wherein each of the two input switches has an input switchable to either a first output or a second output;
  for each of the first and second switches, switching the input terminal between the first and second outputs at a second frequency; and
  connecting the first and second outputs of each of the first and second switches to either (i) a common potential node to output a signal at the first frequency, or (ii) opposite polarity nodes to output a signal at a frequency defined by a mixing product of the first and second frequencies.

38. The method of claim 37, wherein supplying the first signal comprises supplying a positive polarity of the first signal to the input terminal of the first switch, and supplying a negative polarity of the first signal to the input terminal of the second switch.

39. The method of claim 37, wherein supplying the first signal comprises supplying a single-ended signal to the input of one of the input switches, and ac grounding the input of the other input switch.

40. The method of claim 37, wherein the first output of the first switch and the second output of the second switch are coupled to at least one IF load, and wherein switching the input terminal of each of the first and second switches comprises continuously switching the input terminals of the first and second switches between their respective first and second output terminals at the second frequency during mixer operation in both the mixing mode and the bypass mode.

41. In a system which receives a first signal operating at a first frequency, a method for selectively output either the first signal operating at the first frequency, or a signal operating at a frequency defined by a mixing product of the first frequency and a second frequency, the method comprising:
  supplying the first signal at the first frequency to the signal input port of a mixer;
  supplying a second signal at the second frequency to a local oscillator input port of the mixer;
  selectively outputting from an output-port of the mixer either (i) the first signal operating at the first frequency, or (ii) a signal operating at a frequency defined by a mixing product of the first frequency and the second frequency; and
  outputting from a port of the mixer a signal at a harmonic frequency of the second frequency at a signal level which is substantially independent of the signals (i) or (ii).

* * * * *